United States Patent [19]

Kitano et al.

[11] Patent Number: 4,942,452
[45] Date of Patent: Jul. 17, 1990

[54] LEAD FRAME AND SEMICONDUCTOR DEVICE

[75] Inventors: Makoto Kitano; Sueo Kawai, both of Ibaraki; Asao Nishimura, Ushiku; Hideo Miura; Akihiro Yaguchi; Chikako Kitabayashi, both of Ibaraki; Ichio Shimizu, Gunma; Toshio Hatsuda; Toshinori Ozaki, both of Ibaraki; Toshio Hattori, Ushiku; Souji Sakata, Ibaraki, all of Japan

[73] Assignee: Hitachi, Ltd., Tokyo, Japan

[21] Appl. No.: 158,673

[22] Filed: Feb. 22, 1988

[30] Foreign Application Priority Data

Feb. 25, 1987 [JP] Japan .................. 62-40287
Mar. 13, 1987 [JP] Japan .................. 62-56590

[51] Int. Cl.⁵ .................. H01L 23/48; H01L 23/12
[52] U.S. Cl. .................. 357/68; 357/70
[58] Field of Search .................. 357/70, 68, 72; 174/52.4

[56] References Cited

U.S. PATENT DOCUMENTS

| | | | |
|---|---|---|---|
| 4,048,438 | 9/1977 | Zimmerman | 357/70 |
| 4,523,218 | 6/1985 | Kato | 357/70 |
| 4,589,010 | 5/1986 | Tateno et al. | 357/70 |
| 4,797,726 | 1/1989 | Manabe | 357/70 |

FOREIGN PATENT DOCUMENTS 0016555  1/1986  Japan ........................ 357/70

*Primary Examiner*—Rolf Hille
*Assistant Examiner*—S. V. Clark
*Attorney, Agent, or Firm*—Antonelli, Terry, Stout & Kraus

[57] ABSTRACT

A lead frame and a semiconductor device wherein a through hole is formed in the center of a semiconductor chip-mounting surface of a chip pad at the center of the lead frame, the through hole being tapered or being one which corresponds to a surface area that is greater on the surface of the chip-mounting surface of the chip pad than on the surface of the side opposite to the chip-mounting surface thereof. This prevents the occurrence of cracks in the sealing plastic portion in the step of reflow soldering of the lead frame to the substrate.

23 Claims, 5 Drawing Sheets

LEAD FRAME AND SEMICONDUCTOR DEVICE

BACKGROUND OF THE INVENTION

1. Field of the Invention

The present invention relates to a lead frame and a semiconductor device. More specifically, the invention relates to a lead frame and a semiconductor device adapted to preventing package cracking the heat as a result of generated at the time of reflow soldering.

2. Description of the Prior Art

Plastic molded semiconductor devices of the surface mounted type which permits the leads to be directly soldered onto the substrate are becoming established as a standard substitute for conventional devices of the pin inserted type. If packages of such a type are preserved in a high-temperature and high-humidity environment, the plastic will in time absorb moisture which will then be vaporized in an interface between a chip pad (a portion where the chip is mounted which hereinafter is referred to as chip pad) and the plastic portion at the time of heating for soldering (reflow), giving rise to the formation of cracks in the lower corner surface of the chip pad. The cracks develop at the time of reflowing the solder and are usually called reflow cracks.

According to a conventional technique for preventing the reflow cracks from occurring, the back surface of the package is for allowing any vapor generated to escape as is disclosed in Japanese Patent Laid-Open No. 208847/1985.

In order to increase the adhering strength on the interface between the plastic portion and the chip pad while preventing the formation of a gap, furthermore, a method has been proposed according to which the surface of the chip pad opposite to the surface on which the chip is mounted is made rugged as disclosed in Japanese Patent Laid-Open Nos. 199548/1983 and 186044/1965. A technique for perforating a portion that corresponds to the chip pad has also been disclosed in Japanese Patent Laid-Open No. 16357/1984 and in U.S. Pat. No. 4,633,583.

Among the above-mentioned conventional techniques, the method of perforating the lower surface of the package helps prevent the formation of reflow cracks but forms a passage that allows the moisture to flow between the exterior and interior of the package which then results in the corrosion of chip electrodes.

The method which forms a rugged surface on the surface of the chip pad opposite to the chip-mounting surface is effective for preventing the displacement between the chip pad and the adhering surface of the plastic portion, but is not effective for preventing the displacement in a direction in which they will be separated away from each other since the plastic portion easily escapes from the recessed portion.

The moisture contained in the plastic vaporizes at the time of reflow soldering the plastic molded semiconductor device, and the vapor pressure acts on the voids in the interface between the chip pad and the plastic or acts on the cavities in the non-adhered portions to promote the peelng on the interface between the chip pad and the plastic. Even if the cavity becomes progressively larger as a result of peeling, the ambient water content is supplied thereto by diffusion. Therefore, the pressure in the cavity does not decrease, and the plastic portion undergoes deformation giving rise to the formation of cracks starting from a portion where a maximum stress generates at the end of the chip pad (see crack 10 in FIG. 6). According to the above-mentioned Japanese Patent Laid-Open No. 16357/1984, part of the chip pad is removed and plastic is filled in this portion to prevent the peeling by the thermal stress. Moreover, since the thickness of the plastic portion increases equivalently, resistance against the humidity can be improved to some extent. However, stress in the portion where a maximum stress develops is little different from the case of when a portion of the chip pad is not removed because of the deformation that develops when the plastic portion is peeled off from the chip pad being caused by the vapor pressure at the time of reflow soldering. Therefore, this structure is not very effective for coping with the cracks that develop in the plastic portion at the time of reflow soldering.

In order to prevent the chip from breaking at the time of die bonding or in the subsequent temperature aging, it had nitherto been attempted to use a lead frame material having a small coefficient of expansion or to use a die bonding agent having a small coefficient of elasticity. However, the traditional methods limited the range for selecting the materials, pushed up the manufacturing cost, and were not completely effective for suppressing the reflow cracks.

The dimple processing is effective for preventing the development of cracks in the plastic portion at the lower end of the chip pad under the temperature cycle testing. However, when there exists a large difference in the linear thermal expansion coefficient between the lead frame material and the plastic material, the cracks easily develop at the root of the resinous protrusion filled in the dimples.

According to the performation method which forms apertures that reach from the surface of the package to the side of the chip pad opposite to the chip mounting side in order to suppress the reflow cracks, the moisture easily reaches the interface where the chip pad and the plastic part are adhered together and further reaches the surface of the chip through apertures. When used for extended periods of time, therefore, the device becomes defective as the aluminum (A1) wiring is corroded. Further, this method is not quite effective for suppressing the development of cracks in the plastic at the lower end of the chip pad caused by the temperature cycle.

SUMMARY OF THE INVENTION

The object of the present invention is to prevent the reflow cracks resulting from vapor pressure.

Another object of the present invention is to provide a semiconductor device which permits minimum destruction of the semiconductor chips at the time of die bonding or in the subsequent temperature aging, which prevents cracks from developing in the plastic at the lower end of the chip pad even under the temperature cycling test, and which exhibits increasesd resistance against the reflow cracks.

The above object is achieved by forming a through hole of a particular shape in the chip pad, and holding a plastic portion on the chip pad utilizing the hole, to thereby decrease the stress that generates in the plastic portion on the lower corner surface of the chip pad where reflow cracks may develop.

To prevent the cracks from developing in the plastic at the time of reflow, soldering, it is essential that excessive stress is not generated at an end of the chip pad where maximum stress generated even when the plastic portion is peeled off from the chip pad. This requirement is achieved by a structure which is capable of preventing the portion from deforming even when there exists no adhesive force between the plastic portion and the chip pad, i.e., by a structure which does not permit the plastic portion to escape from the chip pad irrespective of the vapor pressure.

A first invention aspect of the present application is concerned with a unitary structure including a lead frame consisting of a chip pad for mounting a semiconductor chip and a group of leads connected to said chip pad along the periphery thereof, the improvement wherein a through hole is formed in at least one place of the chip pad, said through hole having a tilted portion (tapered portion) with respect to the chip-mounting surface of the chip pad.

The through hole may assume the form in which the entire hole is tilted relative to the direction of thickness of the chip pad or be in the form in which the hole as a wedge portion in the thickness of the chip pad, or may assume any other form.

A second inventive aspect of the present application is concerned with a unitary structure including a lead frame consisting of a chip pad for mounting a semiconductor element and a group of leads connected to said chip pad along the periphery thereof, the improvement wherein a through hole is formed in at least one location of the chip pad, said through hole having an opening on the chip-mounting side corresponding to an area that is greater than an area of a hole opening thereof on the side opposite to the chip-mounting side.

A third inventive aspect of the present application is concerned with a semiconductor device which comprises a semiconductor chip, a unitary structure of a chip pad for mounting the semiconductor chip and a group of leads connected to the chip pad along the periphery thereof, and a plastic portion for sealing inner lead portions in the group of leads, the chip pad and the semiconductor chip, wherein a through hole is formed in at least one portion of the chip pad, said through hole having a portion that is tilted relative to the chip-mounting surface of the chip pad.

The through hole may assume the form in which the entire hole is tilted relative to the direction of thickness of the chip pad, the form in which a wedge portion is formed in the direction of thickness of the chip pad, the form in which the area of the hole opening on the chip-mounting side is greater than the area of the hole opening on the side opposite to the chip-mounting side, or it may assume another form.

Throughout the first to third mentioned inventive aspects of the present application, it is desired that the through hole has an area on the chip-mounting side which lies from 24% of the area of the chip pad on the side of the chip-mounting surface through up to 80% of the junction area between the chip pad and the chip. It is further desired to form a groove that surrounds the through hole on the side of the chip-mounting surface of the chip pad.

Furthermore, the above-mentioned objects are achieved by using a lead frame in which the chip pad is comprised of an adhesive-mounting portion, a chip support portion and a lead for connecting both of them together, and by adhering the chip pad and the semiconductor chip together in the adhesive-mounting portion only.

A fourth inventive aspect of the present application is concerned with a semiconductor device which comprises a semiconductor chip, a chip pad for mounting the semiconductor chip, and a group of leads that include a chip pad-hanging lead (chip-mounting portion, i.e., a lead-like support member for supporting the chip pad which is hereinafter referred to as chip pad-hanging lead) that is linked to the chip pad, wherein the chip pad is divided into a peripheral annular portion and a central island portion, the island portion is connected to a portion of the annular portion as a unitary structure so that it is supported by the annular portion, and the semiconductor elment is indirectly mounted on the island portion via an adhesive and is further mounted on the element-mounting surface of the annular portion directly or via a gap (space).

A fifth inventive aspect of the present application is concerned with a semiconductor device having a component structure similar to that of the fourth invention, however, the chip pad is divided into an adhesive-applied portion (i.e., island portion) for adhering semiconductor chip and other portions (annular portion, lead portion, etc.).

In the invention according to the present invention, it through hole be desired that the chip pad is tapered in the direction of its thickness such that the area of the chip pad on the chip side surface thereof, as affected by the size of the through hole opening(s) is smaller than the area of the chip pad surface on the side opposite to the chip side surface. It is further desired to form a groove along the periphery of the island portion to prevent the bonding agent from flowing out.

Preferably, furthermore, the island portion should be lower than the annular portion on the chip-mounting side. In other words, it is desired that the adhesive-mounting portion has a surface that is lower than the surface of the chip support portion so as to form a step therebetween.

It is further desired that a part of the surface of the annular portion on the chip-mounting surface of the chip pad be recessed relative to the remaining surface or surfaces of the annular portion on the chip-mounting surface. In other words, it is desired to form a dent in a portion for supporting the chip in the chip support portion of the chip pad.

The island portion may not necessarily be only one portion but may be divided into a plurality of portions. It is further desired that the island portion has a thickness smaller than that of other lead portions.

The aforementioned modes may be suitably combined together as a matter of course.

To roughly find the stress in the plastic portion on the lower corner surface of the chip pad where the reflow cracks develop, the plastic portion under the chip pad should be modeled in the form of an elongated flat plate which has defined peripheral sides and on which the pressure is uniformly distributed as shown in FIG. 5. In this case, a maximum stress is generated at the center of the long side and is given by the following equation, $$\sigma = \beta \cdot \frac{a^2}{h^2} p \tag{1}$$

where $\beta$ denotes a coefficient of stress determined by the ratio of a long side to a short side, a denotes the length of the short side, h denotes the plate thickness, and p denotes a pressure of the water vapor.

As will be obvious from the equation (1), the stress that is generated increases in proportion to the square power of the chip pad size a. As the chip size increases, therefore, the reflow crack (designated at 10 in FIG. 6) tends to develop easily. To decrease the stress, therefore, the length of the short side should be shortened or the plate thickness should be increased. However, increase in the plate thickness results in the increase in the thickness of the package which is not adapted to flat packages that feature reduced thicknesses. Moreover, the chip pad size is not allowed to become smaller than the size of the chip, and is thus determined by the size of the chip.

According to the present invention, therefore, a plastic-holding portion is provided on a portion of the chip pad to divide the peeling portion of the chip pad. This helps substantially decrease the chip pad size a, and whereby stress in the plastic portion decreases and the reflow cracks are prevented from developing in the resin portion.

According to the present invention, therefore, the distance for holding the plastic portion under the chip pad becomes short when the chip pad and the plastic portion are peeled off from each other, and reduced stress develops in the resin portion due to vapor pressure and reflow cracks are prevented from developing.

According to the present invention, the chip and the chip pad are adhered together only at a central portion of the chip, and the stress that is generated in the chip is nearly equal to a value that results when the chip of a length that corresponds to the adhered portion is adhered over its entire mounting surface. Therefore, even those chips having large sizes do not develop cracks.

As for cracks that may develop in the resin portion under the lower end of the chip pad through the temperature cycle testing, there exists a gap between the annular portion of chip pad and the island portion, and the resin introduced into this gap eliminates relative slippage between the plastic and the surface of the chip pad of the side opposite to the chip. Therefore, the stress is suppressed from developing at the lower portion of the chip pad, and the crack is prevented from developing in the plastic portion.

The coefficient of linear expansion of the plastic is greater than that of the chip pad. Under a high-temperature condition at the time of reflow solderin, therefore, the plastic of a portion where the hole is formed is pushed onto the side surface of the chip pad. Moreover, since the side surface of the chip pad has been made rugged at the time when it was formed, the side surface of the chip pad prevents the plastic from swelling toward the lower side of the chip pad even in the case where the adhering force is insufficient between the plastic and the chip and, further, even when the vapor pressure is applied thereto. Here, the side surface of the island portion works as a fixed fulcrum. Therefore, the stress being generated is less than that of the conventional chip pad, and the reflow cracks hardly develop.

As described above, the present invention provides a semiconductor device which prevents the chips from being destroyed at the time of die bonding and in the subsequent temperature aging, reduces the propensity for the formation of cracks in the plastic portion at the lower end of the chip pad through the temperature cycle testing becomes minimized, and exhibits excellent resistance to the formation of reflow cracks becomes realizable.

According to the present invention, therefore, there is obtained a semiconductor device which does not permit semiconductor chips to be destroyed at the time of die bonding and in the subsequent temperature aging, the formation of cracks in the plastic portion at the lower end of the chip pad through the temperature cycle testing becomes minimized, and excellent resistance to the formation of reflow cracks becomes realizable.

DESCRIPTION OF THE PREFERRED EMBODIMENTS

The lead frame and semiconductor device according to embodiments of the present invention will now be described in conjunction with the drawings.

Figure 1:
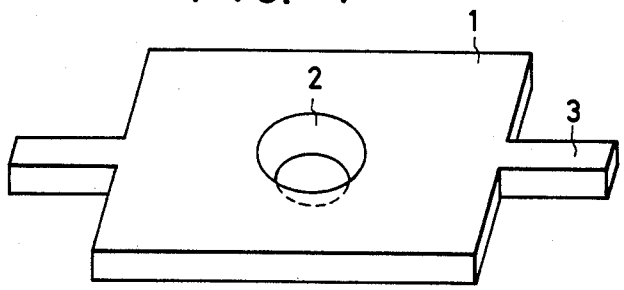
FIGS. 1 and 18 are perspective views illustrating a portion of a lead frame according to an embodiment of the present invention.
Figure 2:
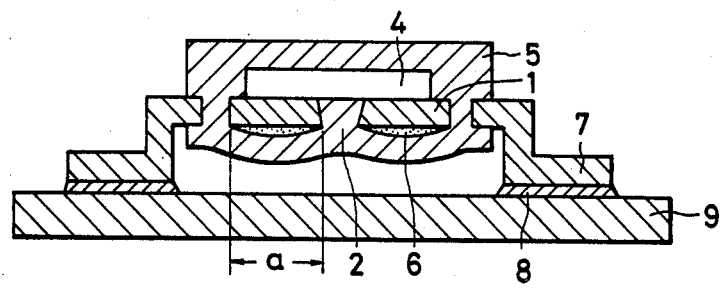
FIG. 2 is a section view of a semiconductor device to which the embodiment of FIG. 1 is adapted.

FIG. 1 is a partial perspective view of the lead frame according to an embodiment of the present invention, and FIG. 2 is a section view of a semiconductor device which employs the above lead frame.

According to this embodiment, a chip pad 1 is supported at its both ends by chip pad-hanging leads 3 and has a through hole 2 formed nearly at the center thereof. As will be obvious from a section view of FIG. 2, the through hole 2 is gradually broadened toward a chip 4 and is gradually narrowed in a direction away from the chip 4. In FIG. 2, reference numeral 5 denotes a plastic portion, 6 denotes vapor, 7 denotes a lead 8 denotes a solder, and 9 denotes a substrate.

Vapor 6 is generated on an interface between the chip pad 1 and the plastic portion 5. The plastic portion 5 is swollen as a result of the pressure of the vapor. In this case, stress is generated in the plastic portion 5 on the lower corner surface of the chip pad. According to this embodiment, however, the through hole 2 of the chip pad 1 holds the plastic portion 5, and the size a becomes smaller than one-half that of the conventional chip pad as will be obvious from the comparison of FIG. 2 with FIG. 6 (diagram of prior art). Therefore, the stress generated in compliance with the equation (1) can be reduced to less than one-fourth to prevent the occurrence of reflow cracks.

Figure 3:
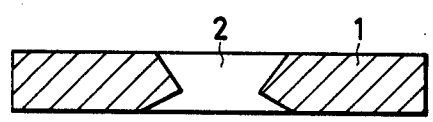
FIGS. 3 and 4 are section views illustrating portions of lead frames according to other embodiments of the present invention.
Figure 4:
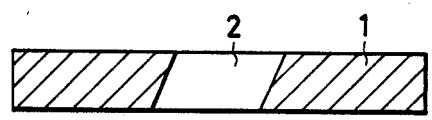
Figure 5:
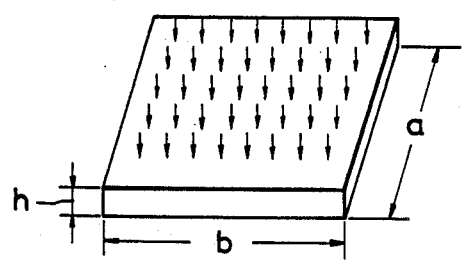
FIG. 5 is a perspective view of a calculation model used for calculating the stress in the lead frame.

Second and third embodiments of the present invention are illustrated in FIGS. 3 and 4. According to the second embodiment, a portion having an area smaller than the area of the through hole 2 on the surface opposite to the chip, is formed in the through hole 2. According to the third embodiment, furthermore, the through hole 2 is formed being tilted with respect to the chip pad 1. The through hole needs be tilted by about 10 degrees relative to the orthogonal direction of the chip-forming surface of the chip pad. In these two embodiments, the plastic portion enters into the through hole 2 so as to be held by the chip pad 1 to prevent the occurrence of reflow cracks like in the first embodiment.

The through hole according to the present invention need not have a circular shape on a plane as shown in FIG. 1, but may have an oval shape, a rectangular shape or a crossed shape to obtain the same effects. Moreover, the through holes may be formed in a plurality of numbers so far as they do not impair the rigidity required for the chip pad 1, to obtain improved effects.

The stress $\sigma_h$ that is generated in the plastic portion in the through hole is expressed by, $$\sigma_h = \frac{A_t}{A_h} \cdot P \quad (2)$$

where $A_t$ denotes the area of the chip pad, and $A_h$ denotes a minimum area in the hole.

The plastic portion is destroyed when the stress exceeds a breaking stress of the plastic $\sigma_B$. Therefore, the following equation must hold, $$\sigma_B > \frac{A_t}{A_h} P \quad (3)$$

and hence, $$A_h > \frac{P}{\sigma_B} A_t \quad (4)$$

At the time of solder reflow, in general, the package is heated at about 220° C., and the saturation vapor pressure of water at this temperature is 0.24 kgf/mm². Further, since the breaking stress of the plastic at this temperature is about 1 kgf/mm², these values are inserted in the equation (4) to obtain, $$A_h > 0.24 A_t \quad (5)$$

That is, the minimum area of the hole should be greater than 24% of the area of the chip pad.

If the through hole becomes too great, the chip pad loses rigidity. Moreover, roughness is formed on the chip-mounting surface and it becomes difficult to join the chip is made rugged wherein the chip pad together. Further, there is very little conducting heat applied from the surface of the chip pad of the side opposite the chip-mounting surface thereof to the chip at the time of wire bonding. Therefore, a limitation is imposed on the size of the through hole. According to experiments conducted by the present inventors, it was found that the through hole should have a surface opening area that is smaller than 80% of the area corresponding to the chip that is to be mounted. The above-mentioned range of the hole applies to each of the through holes of single hole chip pads or to the sum of the through holes of multi-hole chip pads.

Description below is how to form the through hole according to the present invention.

Figure 7:
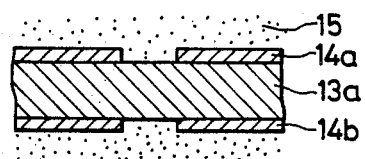
FIGS. 7 and 8 are section views showing a portion of the lead frame to illustrate steps for forming a through hole in the lead frame according to prior art.
Figure 8:

FIG. 7 illustrates a method of forming a through hole in the chip pad according to the conventional etching technology. Etching patterns 14a and 14b of the same shape are tightly adhered onto both sides of the chip pad which is then immersed in an etching solution 15. The etching proceeds from both surfaces of the chip pad, so that there is formed a hole that has a slightly narrower central portion as shown in FIG. 8. According to the conventional method, however, the area is nearly uniform inside the hole and, as a result of which, the plastic that enters therein is not held by the hole.

Figure 9:
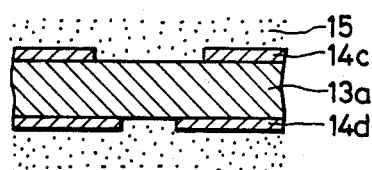
FIGS. 9. 10, 11, 12, 14, 19 and 21 are section views illustrating a portion of the lead frame to illustrate steps for forming a through hole in the lead frame according to embodiments of the present invention.
Figure 10:

FIG. 9 illustrates a method of forming a through hole according to the second embodiment of the present invention. The opening of the hole in an etching pattern 14c on the upper surface of the chip pad is greater than the hole opening in an etching pattern 14d on the lower surface of the chip pad. When the chip pad is immersed in the etching solution 15, therefore, a hole is formed as shown in FIG. 10 and the second embodiment is realized.

Figure 11:
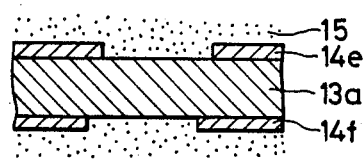
Figure 12:

FIG. 11 illustrates a method of forming a through hole according to the third embodiment of the present invention. Etching patterns 14e and 14f have holes of he same size but at different positions. The hole formed is characterized as being tilted relative to the chip pad surfaces as shown n FIG. 12, and the third embodiment is realized.

Figure 13:
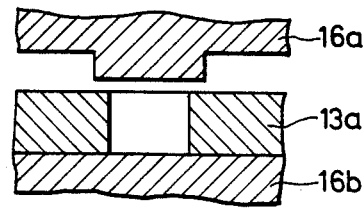
FIG. 13 is a section view illustrating portions of the lead frame and a pressing metal mold to explain a step for forming a through hole.
Figure 14:
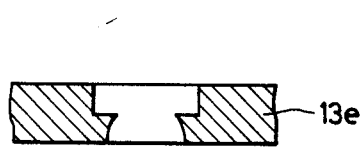

FIG. 13 illustrates a method of realizing the present invention relying upon a pressing action. First, a through hole is formed in the chip pad by a conventional technique, and a press metal mold 16a is pressed onto this portion. Thus, there is provided a portion opening having an area greater than the area in the hole corresponding to a hole opening in the chip-mounting surface of the chip pad of the side opposite to the chip-mounting, surface thereof as shown in FIG. 14.

A fourth embodiment of the present invention will now be described in conjunction with FIGS. 15 and 16. The through hole in the chip pad is not tapered but has a diameter or width which is larger in the chip-mounting surface than a diameter or width in the surface opposite to the chip-mounting side. In this embodiment, furthermore, a thin portion 17 is formed. Holes are formed in a plural number. Reference numeral 18 denotes a die bonding material.

Figure 15:
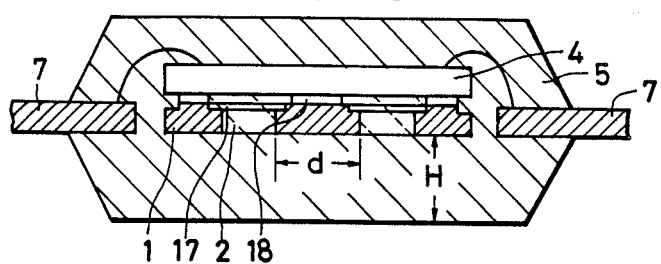
FIGS. 15, 16 and 17 are section views of semi-conductor devices according to further embodiments of the present invention.
Figure 16:
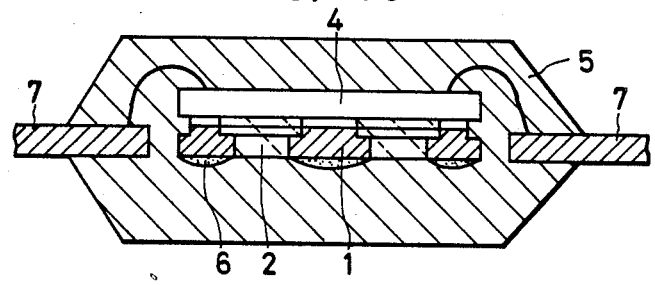

In FIG. 15, through holes 2 are formed in the chip pad 1, and thin portions 17 are formed in the upper portion of the chip pad 1. According to this structure, the plastic portion 5 is molded onto the upper part of the chip pad even when a gap between the chip 4 and the chip pad 1 is completely filled with the die bonding material 18. Even wen the chip pad 1 and the plastic portion 5 are peeled off from each other at the time of reflow soldering, the plastic portion 5 is not separated from the chip pad 1 owing to the plastic being molded on the chip pad, and however, the plastic portion is deformed by the vapor pressure as shown in FIG. 16. Here, if a maximum width d of a portion remaining on the chip pad is set to be smaller than a value given by the following equation, no crack develops in the resin portion, i.e., $$d^2 = K_{IC} \frac{H^{\frac{3}{2}}}{\sqrt{3}} \cdot \frac{1}{p} \qquad (6)$$

where $K_{IC}$: a breaking toughness of the resin portion at a reflow temperature, p: a vapor pressure generated at the time of reflow.

Figure 17:
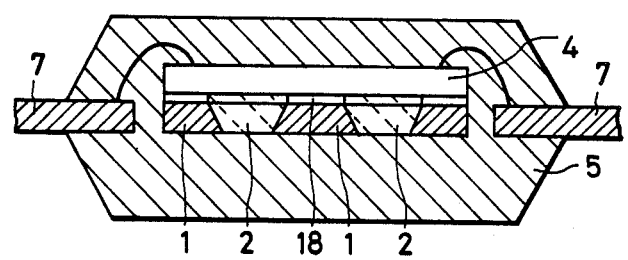
Figure 18:
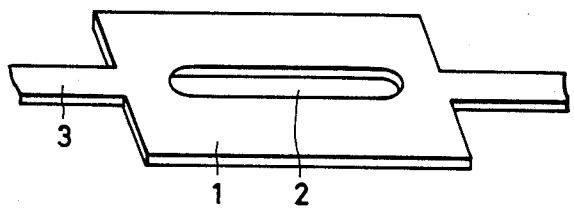

FIG. 17 illustrates a further embodiment in which through holes 2 that are upwardly expanding are formed in a plural number to obtain similar effects as those of the aforementioned embodiments. The through holes 2 may be of a circular shape but should preferably be of a shape close to a rectangular shape or close to an elongated circle as shown in FIG. 18 to obtain improved reinforcing effect.

Figure 19:
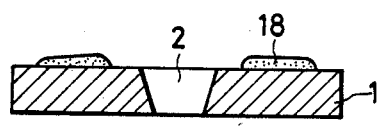
Figure 20:
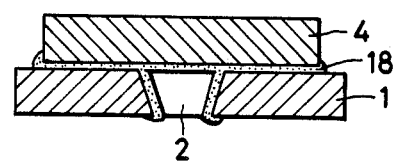
FIG. 20 is a section view of the state where an element is mounted on the lead frame according to the embodiment of FIG. 19.

Finally, described below are problems involved in implementing the invention into practice and a method of solving the problems. FIG. 19 shows that state where an adhesive 18 is applied to join the chip to the chip pad of the present invention, and FIG. 20 shows the state where the chip 4 is mounted and joined after the state of completion FIG. 19. As shown in FIG. 20, when applied in an excess amount, the adhesive 18 may flow onto the side surface of the through hole 2. If the plastic portion is molded after the adhesive is hardened under the state of FIG. 20, the plastic portion and the adhesive may peel off from each other to lose the effects of the present invention.

Figure 21:
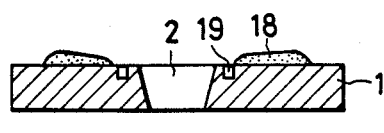
Figure 22:
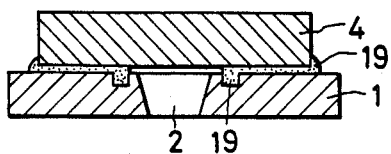
FIG. 22 is a section view of the state where a chip is mounted on the lead frame according to the embodiment of FIG. 21.

In order to solve such a problem, a groove 19 for preventing the overflow of adhesive 18 should be provided in the chip-mounting surface of the chip pad to surround the through holes as shown in FIG. 21. FIG. 22 illustrates the state where the chip 4 is mounted on the chip pad 1 that is provided with the groove 19 for preventing the overflow of adhesive. As shown in FIG. 22, an extra adhesive is prevented by the groove 19 from overflowing and does not flow into the through hole.

The following description of the embodiments for calculating the effects is based upon the presumption of using a 256 KDRAM package of the conventional construction having a chip size of 4.0 mm × 9.0 mm, a chip pad size of 4.2 mm × 9.3 mm, using a lead frame composed of a copper (Cu) alloy being die-bonded with a solder.

Figure 23:
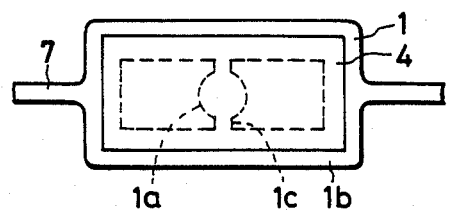
FIGS. 23, 26, 28, 30, 32 and 34 are plan views of chip pad for semiconductor devices according to the embodiments of the present invention.

In FIG. 23, the semiconductor chip 4 is secured onto the chip pad 1 using an adhesive, and terminals on the semiconductor chip 4 are electrically connected through fine metal wires to a plurality of leads 7 arranged around the chip pad 1. The lead frame consists of leads that include chip pad-hanging leads and the chip pad 1, and is sealed with the resin portion 5 and is then cut away from the outer frame to which it had been coupled.

The semiconductor chip 4 is composed of silicon (Si) whose coefficient of linear expansion $\alpha$ is about $3 \times 10^{-6}/°$ C. The lead frame is usually composed of a 42 alloy ($\alpha = 5 \times 10^{-6}/°$ C.) or a copper alloy ($\alpha = 17 \times 10^{-6}/°$ C.). The plastic 5 has a coefficient of linear expansion $\alpha$ of 20 to $30 \times 10^{-6}/°$ C. In this embodiment, the chip pad 1 is divided into a central island portion 1a and a peripheral annular portion 1b. Symbol 1c denotes leads the couple the island portion 1a and the annular portion 1b together. As is obvious from FIG. 24, furthermore, the adhesive 18 is applied onto the island portion 1a only.

In the conventional semiconductor device, the constituent materials have dissimilar coefficients $\alpha$ of linear expansion. Therefore, the chips constructed in a large size are accompanied by such problems as cracking resulting from the step of die bonding for joining the chip and the chip pad together or due to temperature aging after the die bonding and cracking in the plastic at the lower edge of the chip pad due to cooling after the semiconductor device is sealed with plastic or due to temperature cycle testing. Furthermore, if the semiconductor device left to stand in the air for extended periods of time is mounted on the surface of the substrate, cracks often develop in the plastic (hereinafter referred to as crack in the solder reflow). Contents of the defective modes will now be described.

The thermal stress is generated at the time of die bonding since the semiconductor chip and the chip pad material have dissimilar coefficients of linear expansion. If the adhesive yields, therefore, tensile stress results on the surface of the element due to temperature aging after the die bonding.

Figure 35:
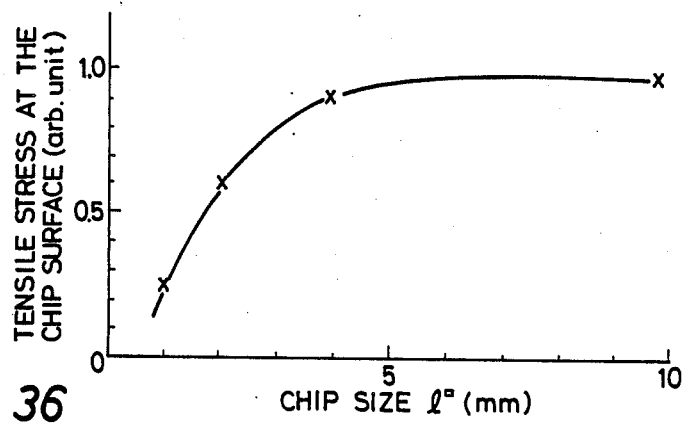
FIG. 35 is a diagram showing stress on the chip surface.

In the case of the copper (Cu) lead frame and the adhesive composed of a 95 Pn-5 Sn solder, the tensile stress becomes as shown in FIG. 35. The tensile stress increases with the increase in the chip size, and often exceeds the breaking strength of the chip. It is therefore attempted to use a lead frame material of the Fe-Ni type having a small coefficient of expansion and to use a die bonding agent having a very small elasticity, to decrease the stress that results in the chip.

Figure 36:
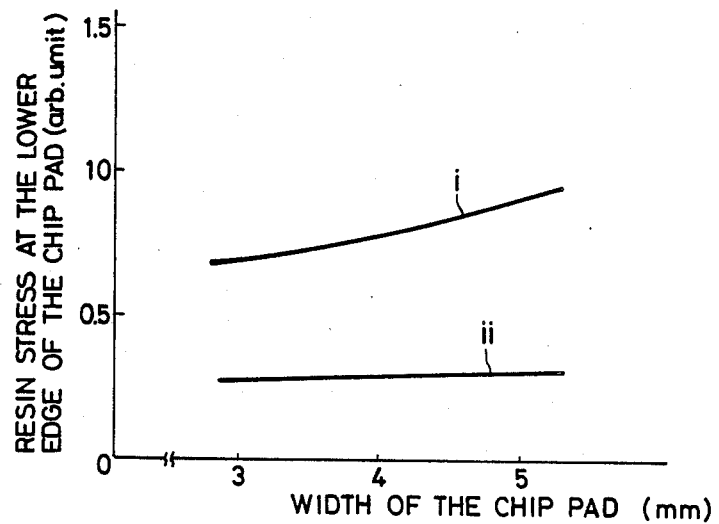
FIG. 36 is a diagram showing resin stress at the lower edge of the chip pad.

The cracks develop in the plastic at the lower corner of the chip pad during the temperature cycle testing since the stress developed is concentrated at the lower corner of the chip pad due to difference in the coefficient of linear expansion between the lead frame material and the plastic material. In particular, if the plastic peels off from the chip pad of the side opposite to the chip, the stress at the lower corner of the chip pad increases stepwise as shown in FIG. 36. The stress increases so rapidly with the increase in the chip pad siz (chip size) that cracks develop in the plastic. A curve i represents peeling between the chip pad and the plastic, which exhibits relative slippage, and a curve ii represents whole-surface adhesion without relative slippage. To prevent the cracks from developing in the plastic at the lower corner of the chip pad, holes are formed (referred to as dimple formation) in the chip pad on the side opposite to the chip, and the plastic is charged into the holes thereby preventing the relative slippage caused by the peeling between the chip pad and the plastic portion.

To mount the semiconductor device on the substrate practically, the solder connection portion of the lead and the connection portion of the substrate are tentatively adhered together with a solder paste or the like, and the whole substrate is heated up 200° to 250° C. for several tens of seconds to several minutes, for example, by an infrared ray reflow equipment or by a vapor phase reflow equipment. The semiconductor device is thus joined with the solder and is mounted on the substrate. This is called a reflow soldering process.

In fact, however, cracks develop in the plastic during the reflow soldering process if the above-mentioned reflow is carried out using the semiconductor device that is left to stand in the atmosphere for extended periods of time or using the semiconductor device that is preserved in an environement having a relatively high humidity even for a short period of time.

This is due to the following reasons. That is, the plastic absorbs moisture in the air while the semiconductor device is being preserved, and the moisture remains in the plastic or in a small gap between the plastic portion and the surface of the chip pad on which the plastic is adhered. If the semiconductor device that has absorbed moisture is subjected to the reflow soldering process, the moisture on the interface between the plastic and the chip pad turns into vapor and expands due to quick heating, and a excessive stress is generated in the plastic as a result of the vapor pressure. Even if there is no moisture on the interface of adhesion, the moisture contained in the plastic diffuses and is condensed on the interface of adhesion giving rise to the generation of stress in the plastic in a manner as described above.

Figure 6:
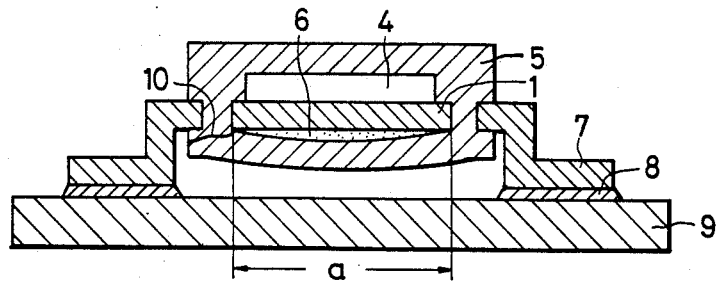
FIG. 6 is a section view of a semiconductor device according to prior art.

Thus, there develop reflow cracks as designated at 10 in FIG. 6.

Figure 24:
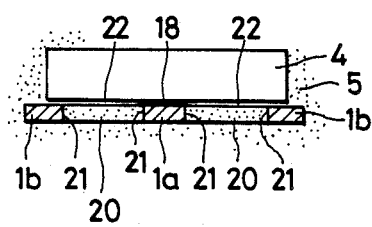
FIG. 24 is a section view of FIG. 23.

According to this embodiment as shown in FIGS. 23 and 24, however, the chip pad 1 is divided into an island portion 1a and an annular portion 1b. At the time of die bonding, therefore, the adhesive is applied to the island portion 1a only, and the annular portion 1b plays the role of a stabilizer plate for stably placing the chip on the chip pad 1. First, discussed below is an effect for improving chip cracks that in many cases develop at the center of the long side of the chip. Therefore, if it is presumed that the long side has a size of 9 mm □ which is a representative size of the chip and if the chip is adhered over a central area of 2 mm □ only, then the stress that is generated is in the chip can be reduced to 60% in light of FIG. 35, compared with that of the conventional chip that is adhered over its entire surface.

After the die bonding, the package is prepared through the step of molding. Next, discussed below are cracks that develop in the plastic at the lower corner of the chip pad due to the temperature cycle testing. The plastic cracks at the lower corner of the chip pad develop in many cases at the center in the short side of the chip pad. Therefore, a chip pad width of 4.2 mm is selected. In FIG. 36, the chip pad is presumed to have a width of 4.2 mm. If the relative slippage is eliminated according to the embodiment of the invention, then the plastic stress at the lower edge of the chip pad can be reduced to 38% compared with that of when there exists a relative slippage between the chip pad on the side opposite to the chip and the plastic of the prior art.

Finally, the effect for the reflow soldering is calculated. In using the conventional chip pad having a size of 4.3 mm×9.3 mm, it is presumed that the back surface of the chip and the plastic interface are peeled off from each other in the embodiment of the invention, the length of the short side of the peeled portion being 2.4 mm, and the length of the long side being 2.6 mm. In compliance with the equation (1), therefore, B=0.5 and a=4.2 mm in the case of the conventional chip pad, and B=0.33 and a=2.4 mm in the case of the chip pad of the embodiment of the invention. According to the embodiment of the present invention, therefore, a maximum stress $\sigma_{max}$ of the semiconductor devices decreases to about 22% compared with that of the conventional device. If the breaking strength of the plastic remains the same, resistance against the pressure increases by 4.6 times.

According to the embodiment of the invention as described above, the strength can be strikingly increased against the propensity for chip cracks, against plastic cracks at the lower corner of the chip pad caused by the temperature cycle testing, and against reflow cracks.

As for the plastic cracks at the lower corner of the chip pad caused by the temperature cycle testing, the relative slippage between the chip pad of the side opposite to the chip and the plastic is prevented by the plastic 20 that is charged into the portions formed by punching the chip pad. Therefore, generation of the stress can be suppressed at the lower corner of the chip pad, and plastic cracks are prevented from developing.

The coefficient of linear expansion of the plastic is greater than that of the chip pad. When subjected to a high temperature at the time of reflow soldering, therefore, the plastic being charged into perforated portions as designated at 20 in FIG. 24 is pressed onto the side surfaces 21 of the chip pad. Moreover, since the side surfaces of the chip pad prepared have been made rugged, the side surfaces of the chip pad designated at 21 in FIG. 24 prevent the plastic from swelling toward the lower side of the chip pad even in the case where the adhesive force is insufficient between the plastic designated at 22 in FIG. 24 and the chip. In FIG. 24, the side surfaces 21 serve as fixed fulcrums. Therefore, the length a in the equation (1) becomes sufficiently small compared with that of the conventional chip pad, generation of the stress is further suppressed, and increased resistance is exhibited against the reflow cracks.

Figure 25:
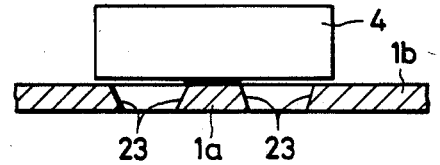
FIG. 25 is a section view of a chip pad for a semiconductor device according to an embodiment of the present invention.
Figure 26:
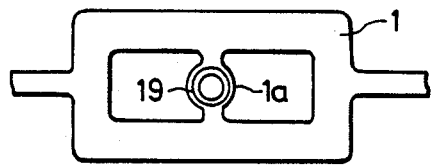

FIGS. 25 to 34 illustrate further embodiments. Referring to FIG. 25, the chip pad is tapered in the direction of the thickness thereof as designated at 23 to more reliably prevent propensity for the plastic from swelling beyond the chip pad. Referring to FIG. 26, a groove 19 is formed to surround the adhesive-mounting portion to prevent the adhesive from flowing out. The groove should have a size of, for example, about 0.2 mm in width and 0.2 mm in depth.

Figure 27:
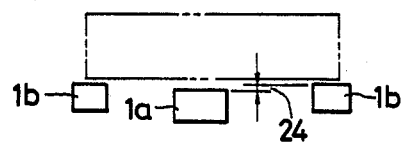
FIG. 27 is a section view of FIG. 28.
Figure 28:
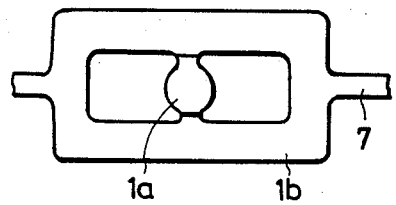

Referring to FIGS. 27 and 28, a step 24 of a height δ is provided between the surface of the chip support portion and the surface of the adhesive-mounting portion. This makes it possible to minimize the gap between the chip and the chip support portion. The height δ should be from about 10 μm to about 50 μm.

Figure 29:
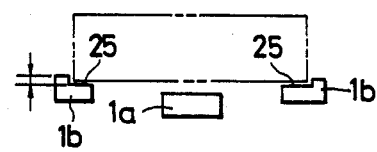
FIG. 29 is a section view of FIG. 30.
Figure 30:
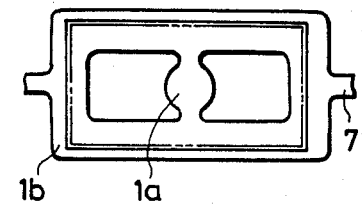

Referring to FIGS. 29 and 30, a dent 25 is formed in a portion of the chip support portion for supporting the chip, to facilitate the positioning of the chip.

Figure 31:
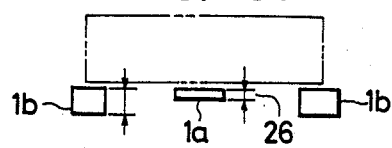
FIG. 31 is a section view of FIG. 32.
Figure 32:
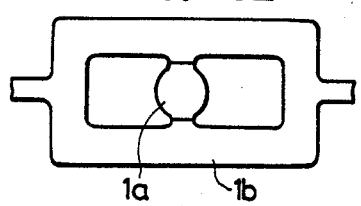

With reference to FIGS. 31 and 32, the lead of the adhesive-mounting portion has a thickness 26 smaller than the thickness of the support portion. This makes it possible to further decrease the stress that generates in the chip.

Figure 33:
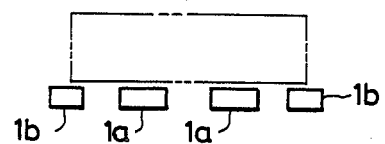
FIG. 33 is a section view of FIG. 34.
Figure 34:
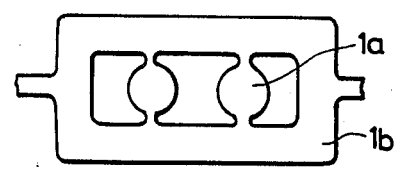

With reference to FIGS. 33 and 34, there are provided two chip mounting portions. In this way, the chip-mounting portions may be provided in a plural number as required.

The aforementioned embodiments may be put into practice individually or in suitable combinations.

According to the aforementioned embodiments, only a central portion of the chip is joined in die-bonding the chip and the chip pad together. Therefore, the stress that is generated in the chip as a result of the die bonding or as a result of the subsequent temperature aging is suppressed, and the chip is prevented from breaking.

Since the plastic is charged into a hole formed in the chip pad to form a protrusion of the plastic, there develops no relative slippage in the adhering portion between the plastic and the chip pad of the side opposite to the chip. Therefore, the plastic stress that would otherwise result at the lower edge of the chip pad decreases significantly, and the life of the device increases greatly against the temperature cycle.

Furthermore, since side surfaces of the hole formed in the chip pad prevent the plastic from swelling despite the vapor pressure at the time of reflow soldering, the resistance increases greatly against the reflow cracks.

What is claimed is:

1. In a lead frame comprising a unitary structure of a chip pad for mounting a semiconductor chip on a chip-mounting surface thereof and a group of leads connected to said chip pad along said chip pad, the improvement wherein a through hole is formed in at least a portion of said chip pad, said through hole being projected in a direction which is tilted relative to a direction from the plane of the chip-mounting surface of said chip pad.

2. A lead frame according to claim 1, wherein said through hole in its entirety is tilted relative to a direction of thickness of said chip pad.

3. A lead frame according to claim 1, wherein said through hole is characterized as having a relatively narrower opening within the chip pad itself than at either the chip-mounting surface through hole opening end or at the through hole opening end at an opposing surface thereof.

4. A lead frame according to claim 1, wherein said through hole has an area on the chip-mounting surface of said chip pad that lies over a range of from 24% of the area of the chip-mounting surface of the entire chip pad itself to 80% of the actual chip-mounting surface area required of said chip pad to which said semiconductor chip is adhered to.

5. A lead frame according to claim 1, wherein a groove is formed in the chip-mounting surface of said chip pad to surround the through hole.

6. In a lead frame comprising a unitary structure of a chip pad for mounting a semiconductor chip on a chip-mounting surface thereof, and a group of leads connected to said chip pad along said chip pad, the improvement wherein a through hole is formed in at least a portion of said chip pad, said through hole having an opening on the chip-mounting surface of said chip pad that is greater in area than the area corresponding to an opening thereof on a surface of said chip pad opposing the chip-mounting surface thereof.

7. A lead frame according to claim 6, wherein the area of said through hole corresponding to an opening on the chip-mounting surface of said chip pad lies over a range of from 24% of the chip-mounting surface of the entire chip pad itself to 80% of the actual chip-mounting surface area required of said chip pad to which said semiconductor chip is adhered to.

8. A lead frame according to claim 6, wherein a groove is formed in the chip-mounting surface of said chip pad to surround the through hole.

9. In a semiconductor device comprising a semiconductor chip, a chip pad having a chip-mounting surface for mounting said semiconductor chip, a group of leads connected to said chip pad as a unitary structure along said chip pad, inner leads disposed within said group of leads, and a plastic portion for sealing the semiconductor chip, the improvement wherein a through hole is formed in at least a portion of said chip pad, said through hole being projected in a direction which is tilted relative to a direction from the plane of the chip-mounting surface of said chip pad.

10. A semiconductor device according to claim 9, wherein said through hole in its entirety is angularly tilted with respect to the direction of thickness of said chip pad.

11. A semiconductor device according to claim 9, wherein said through hole is characterized as having a relatively narrower opening within the thickness of the chip pad itself than at either the chip-mounting surface through hole opening end or at the through hole opening end at an opposing surface thereof.

12. A semiconductor device according to claim 9, wherein said through hole has an opening on the chip-mounting surface of said chip pad of an area that is greater than the area of an opening of said through-hole on the surface of said chip pad opposing the chip-mounting surface thereof.

13. A semiconductor device according to claim 9, wherein said through hole has an area on the chip-mounting surface of said chip pad that lies over a range of from 24% of the chip-mounting surface of the entire chip pad itself to 80% of the actual chip-mounting surface area required of said chip pad to which said semiconductor chip is adhered to.

14. A semiconductor device according to claim 9, wherein a groove is formed in the chip-mounting surface of said chip pad to surround said through hole.

15. In a semiconductor device comprising a semiconductor chip, a chip pad having a chip-mounting surface for mounting said semiconductor chip, and a group of leads inclusive of leads that are linked to said chip pad to hold it, the improvement wherein said chip pad is divided into a peripheral annular portion thereof and a central island portion, said island portion thereof being linked to a part of said annular portion thereby resulting in a unitary structure wherein it is supported by said annular portion, said semiconductor chip being indirectly mounted on said island portion via an adhesive and being further mounted on the chip-mounting surface of said annular portion via a gap.

16. A semiconductor device according to claim 15, wherein said chip pad has sides that are tapered in the direction of thickness thereof such that the area thereof on the chip-mounting surface is less than the area of the surface of said chip pad opposing the chip-mounting surface thereof.

17. A semiconductor device according to claim 15, wherein a groove is formed to surround said island portion in order to prevent a bonding agent which is used as an adhesive for mounting from flowing out.

18. A semiconductor device according to claim 15, wherein said island portion is recessed relative to said annular portion on the chip-mounting surface of said chip pad.

19. A semiconductor device according to claim 15, wherein a part of the surface of said annular portion on the chip-mounting surface of said chip pad is recessed with respect to the remaining surface of the annular portion of the chip-mounting surface.

20. A semiconductor device according to claim 15, wherein said island portion is divided into a plurality of portions.

21. A semiconductor device according to claim 15, wherein said island portion is thinner than said annular portion or is thinner than any lead of said group of leads.

22. In a semiconductor device comprising a semiconductor chip, a chip pad having a chip-mounting surface for mounting said semiconductor chip thereon, and a group of leads inclusive of leads that are linked to said pad to hold it, the improvement wherein said chip pad is divided into an annular portion and a central island portion, said island portion being linked to a part of said annular portion thereby resulting in a unitary portion, said semiconductor chip being indirectly mounted on said island portion via an adhesive and being further mounted on the chip-mounting surface of said annular portion directly.

23. A semiconductor device according to claim 15, wherein said island portion is thinner than said annular portion and is thinner than any lead of said group of leads.

* * * * *